United States Patent
Knight et al.

(10) Patent No.: US 9,202,952 B2
(45) Date of Patent: Dec. 1, 2015

(54) PLASMON INDUCED HOT CARRIER DEVICE, METHOD FOR USING THE SAME, AND METHOD FOR MANUFACTURING THE SAME

(75) Inventors: Mark William Knight, Houston, TX (US); Heidar Sobhani Khakestar, Houston, TX (US); Peter Nordlander, Houston, TX (US); Nancy J. Halas, Houston, TX (US)

(73) Assignee: William Marsh Rice University, Houston, TX (US)

( * ) Notice: Subject to any disclaimer, the term of this patent is extended or adjusted under 35 U.S.C. 154(b) by 0 days.

(21) Appl. No.: 13/884,552

(22) PCT Filed: Nov. 11, 2011

(86) PCT No.: PCT/US2011/060371
§ 371 (c)(1),
(2), (4) Date: Jul. 23, 2013

(87) PCT Pub. No.: WO2012/065063
PCT Pub. Date: May 18, 2012

(65) Prior Publication Data
US 2013/0299933 A1  Nov. 14, 2013

Related U.S. Application Data

(60) Provisional application No. 61/413,136, filed on Nov. 21, 2010.

(51) Int. Cl.
*H01L 31/0236* (2006.01)
*H01L 31/0384* (2006.01)
*H01L 31/108* (2006.01)

(52) U.S. Cl.
CPC ...... *H01L 31/02363* (2013.01); *H01L 31/0384* (2013.01); *H01L 31/108* (2013.01)

(58) Field of Classification Search
CPC combination set(s) only.
See application file for complete search history.

(56) References Cited

U.S. PATENT DOCUMENTS

| 2003/0107741 A1* | 6/2003 | Pyo et al. ............ 356/445 |
| 2008/0318031 A1* | 12/2008 | Smith ............ 428/333 |
| 2010/0126566 A1* | 5/2010 | Ji ............ 136/252 |
| 2011/0215298 A1* | 9/2011 | Kim et al. ............ 257/24 |

(Continued)

FOREIGN PATENT DOCUMENTS

WO  2009/012397 A2  1/2009

OTHER PUBLICATIONS

"Seeing photons: Progress and Limits of Visible and Infrared Sensor Arrays" Committee on Developments in Detector Technologies; National Research Council, Washington, D.C., 2010 (195 pages).

(Continued)

*Primary Examiner* — Khaja Ahmad
(74) *Attorney, Agent, or Firm* — Osha Liang LLP

(57) ABSTRACT

In general, the invention relates to a unit that includes a semiconductor and a plasmonic material disposed on the semiconductor, where a potential barrier is formed between the plasmonic material and the semiconductor. The unit further includes an insulator disposed on the semiconductor and adjacent to the plasmonic material and a transparent conductor disposed on the plasmonic material, where, upon illumination, the plasmonic material is excited resulting the excitation of an electron with sufficient energy to overcome the potential barrier.

17 Claims, 7 Drawing Sheets

(56) References Cited

U.S. PATENT DOCUMENTS

2011/0240104 A1* 10/2011 Lee et al. .................. 136/252
2013/0075699 A1* 3/2013 Brown et al. ................ 257/21

OTHER PUBLICATIONS

T. Ishi et al., "Si nano-photodiode with a surface plasmon antenna," Japanese Journal of Applied Physics, vol. 44, No. 12, Mar. 4, 2005 (3 pages).
A. Rogalski, "Infrared Detectors: Status and Trends," Progress in Quantum Electronics 27, 2003 (152 pages).
T. Inagaki et al., "Photoacoustic Observation of Nonradiative Decay of Surface Plasmons in Silver," Physical Review B, vol. 24, No. 6, Sep. 15, 1981 (3 pages).
T. Inagaki et al., "Photoacoustic Study of Surface Plasmons in Metals," Applied Optics, vol. 21, No. 5, Mar. 1, 1982 (6 pages).
J. Endriz et al., "Surface-Plasmon-One-Electron Decay and its Observation in Photoemission," Physical Review Letters, vol. 24, No. 2, Jan. 12, 1970 (5 pages).
J. Hofmann et al., "Plasma Resonance in Photoemission of Silver," Physica Status Solidi 30, Sep. 27, 1968 (4 pages).
J. Pérez-Juste et al., "Gold Nanorods: Synthesis, Characterization and Applications," Coordination Chemistry Reviews 249, Apr. 1, 2005 (31 pages).
R. Fowler, "The analysis of Photoelectric Sensitivity Curves for Clean Metals at Various Temperatures," Physical Review, vol. 38, Jul. 1, 1931 (12 pages).
C. Scales et al., "Thin-Film Schottky Barrier Photodetector Models," IEEE Journal of Quantum Electronics, vol. 46, No. 5, May 2010 (11 pages).
A. Cowley, "Titanium-Silicon Schottky Barrier Diodes," Solid-State Electronics, vol. 12, 1970 (12 pages).
P. Johnson et al., "Optical-Constants of Noble-Metals," Physical Review B, vol. 6, No. 12, Dec. 15, 1972 (10 pages).
International Search Report issued in PCT/US2011/060371 mailed on Feb. 13, 2012 (3 pages).
Written Opinion of the International Searching Authority issued in PCT/US2011/060371 dated May 12, 2013 (6 pages).
International Preliminary Report on Patentability issued in PCT/US2011/060371 dated May 14, 2013 (7 pages).
Fukuda, Mitsuo et al., "Light detection enhanced by surface plasmon resonance in metal film", Applied Physics Letters, AIP, American Institute of Physics, Melville, NY, US, vol. 96, No. 15; Apr. 15, 2010; pp. 153107-153107 (4 pages).
M.W. Knight et al., "Photodetection with Active Optical Antennas", Science, vol. 332, No. 6030; May 6, 2011; pp. 702-704 (4 pages).
S.M. Sze and Kwok K. Ng, "Physics of Semiconductor Devices, 3rd Edition", John Wiley & Sons Inc.; Hoboken, NJ, 2007; pp. 176, 228, 352-358, 437, 450-452 (13 pages).

* cited by examiner

PLASMON INDUCED HOT CARRIER DEVICE, METHOD FOR USING THE SAME, AND METHOD FOR MANUFACTURING THE SAME

CROSS-REFERENCE TO RELATED APPLICATIONS

This application claims priority pursuant to 35 U.S.C. §119 (e) to U.S. Provisional Patent Application No. 61/413,136 entitled "Plasmon induced Hot Carrier Device, Method for using the Same, and Method for Manufacturing the Same," filed on Nov. 12, 2010, the disclosure of which is incorporated by reference herein in its entirety.

STATEMENT REGARDING FEDERALLY SPONSORED RESEARCH OR DEVELOPMENT

The present invention was made with government support by National Science Foundation under Grant Number DGE-0504425. The present invention was also made with government support by Department of Defense under Grant Number N00244-09-1-0067. The government has certain rights in the invention.

BACKGROUND

Development of enhanced Infrared (IR) detectors through the use of plasmons as a means of generating large local electromagnetic field to augment preexisting types of devices offers many benefits, including higher signal to noise ratios and faster operation. However, enhancements alone restrict progress to the two principal IR detector mechanisms: thermal and engineered bandgap. Thermal detectors rely on temperature changes induced by incident radiation, with a correspondingly slow detection speed. Engineered bandgap detectors collect quanta of incident radiation, which can be both fast and efficient. However, in the IR band these quantum detectors rely on compound semiconductors, which are both expensive and have materials manufacturing complexities that are difficult to streamline. These limitations suggest that a new type of detector is needed in order to make quantum detection simple, fast, flexible and inexpensive.

SUMMARY

In general, in one aspect, the invention relates to a unit including a semiconductor, a plasmonic material disposed on the semiconductor, wherein a potential barrier is formed between the plasmonic material and the semiconductor, an insulator disposed on the semiconductor and adjacent to the plasmonic material, and a transparent conductor disposed on the plasmonic material, wherein, upon illumination, the plasmonic material is excited resulting the excitation of an electron with sufficient energy to overcome the potential barrier.

In general, in one aspect, the invention relates to an apparatus that includes a plurality of units, wherein each unit includes a semiconductor, a plasmonic material disposed on the semiconductor, wherein a potential barrier is formed between the plasmonic material and the semiconductor, an insulator disposed on the semiconductor and adjacent to the plasmonic material, and a transparent conductor disposed on the plasmonic material, wherein, upon illumination, the plasmonic material is excited resulting the excitation of an electron with sufficient energy to overcome the potential barrier.

In general, in one aspect, the invention relates to A method for manufacturing a unit, including spin coating a resist of thermal oxide onto a first surface of a semiconductor to obtain a spin-coated semiconductor, baking the spin-coated semiconductor to obtain a baked semiconductor, exposing the resist on the baked semiconductor using e-beam lithography with a resonator pattern to obtain an exposed semiconductor, developing the exposed semiconductor to obtain a developed semiconductor, etching a pattern into the developed semiconductor to obtain an etched semiconductor, depositing a layer of plasmonic material on the etched semiconductor to obtain a deposited semiconductor, performing, on the deposited semiconductor, a lift off using a chemical solvent to obtain plasmonic material in the pattern on the front of the semiconductor, bonding an ohmic contact to a second surface of the semiconductor, and sputter coating a transparent conducting layer over the first surface of the semiconductor to obtain the unit.

Other aspects of the invention will be apparent from the following description and the appended claims.

DETAILED DESCRIPTION

Figure 1:
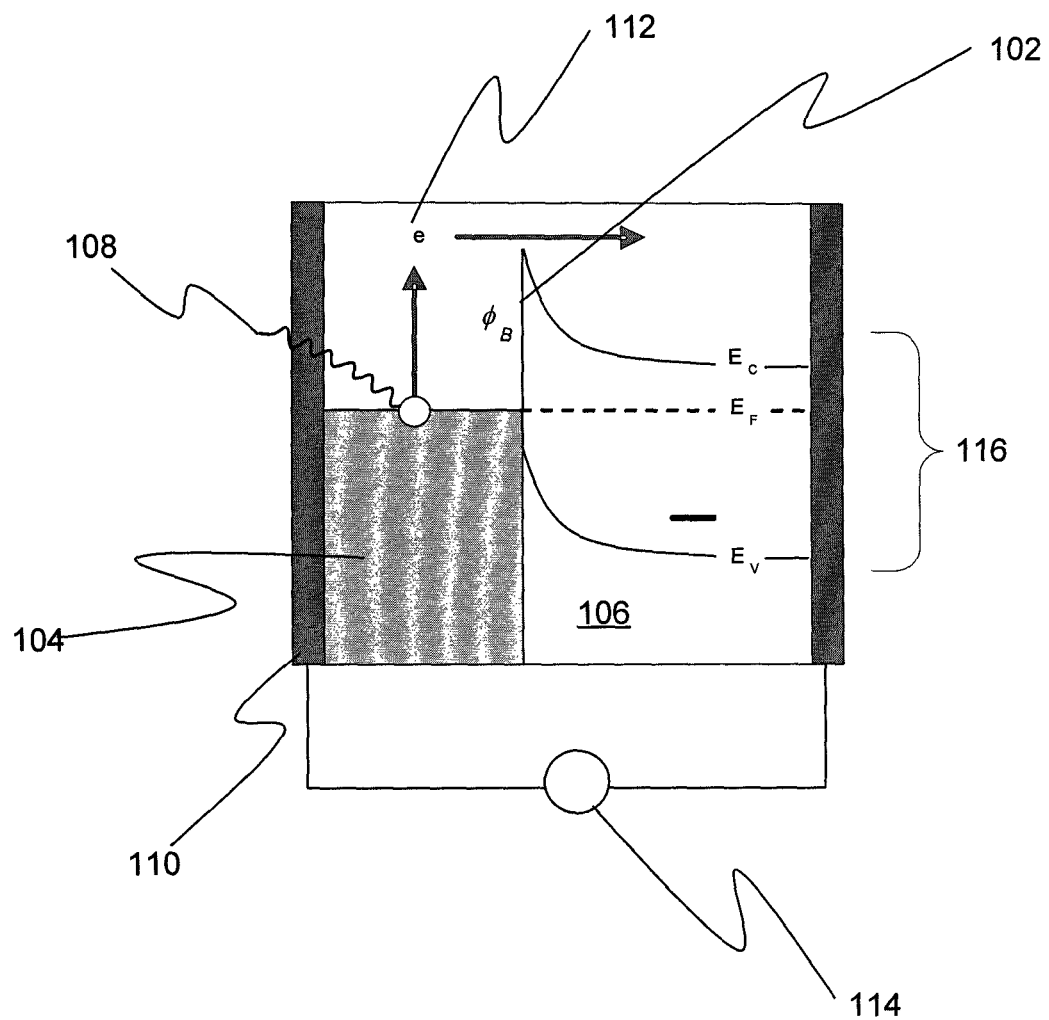
FIG. 1 shows a schematic in accordance with one or more embodiments of the invention.

Specific embodiments of the invention will now be described in detail with reference to the accompanying figures. Like elements in the various figures are denoted by like reference numerals for consistency. Further, the use of "FIG." in the drawings is equivalent to the use of the term "Figure" in the description.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to a class of photon to electron converters. Further, embodiments of the invention relate to devices and methods of manufacturing devices (or portions thereof) for generating an electron current in response to light at photon energies greater than a potential barrier in the device.

In one or more embodiments of the invention, the potential barrier may be formed using metal-semiconductor, semiconductor-semiconductor, or metal-metal interfaces. In one or more embodiments of the invention, a metal-semiconductor potential barrier may be formed by a Schottky junction. Also, in one or more embodiments of the invention, the semiconductor may be an elemental semiconductor (for example, but not limited to, silicon or germanium), an engineered bandgap compound semiconductor, or an organic semiconductor. All semiconductor types may allow embodiments of the invention to function either with or without a bias.

FIG. 1 is schematic of a unit 100 in accordance with one or more embodiments of the invention. The unit 100 in FIG. 1, includes a potential barrier (denoted as 102) formed at the interface of a metallic plasmonic material 104 and a semi-conductor 106. For example, the semi-conductor 106 may be an n-type semi-conductor. Electromagnetic radiation 108 is incident on the metallic plasmonic material 104 and excites the plasmon resonance of the material. The shape and the material of the metallic plasmonic material 104 determines the plasmon resonance and, thus, the nature of the electro-magnetic radiation necessary to excite a "hot" electron 112. For example, the electromagnetic radiation may be in the form of ultraviolet (UV), visible, or infrared light. The magnitude of the potential barrier 102 (as illustrated in the energy band diagram 116 that is superimposed on the unit) is determined by the selection of materials of the plasmonic material 104 and the semiconductor 106.

In one or more embodiments of the invention, the potential barrier may be formed by a metal-metal interface. In such embodiments, a small gap may be used to form a tunneling barrier, which may act as the potential barrier. Symmetric design may allow a net current flow with an applied bias voltage. For zero bias voltage operation, the embodiments of the invention may require an asymmetric junction, or asymmetric illumination, to induce hot electron generation on one side of the potential barrier.

In one or more embodiments of the invention, the potential barrier may be formed by a semiconductor-semiconductor interface. In such embodiments, the induced dipole at the interface between two different semiconductors may result in a potential barrier in accordance with one or more embodiments of the invention. Because doped semiconductors may support plasmons in the far infrared or terahertz region of the spectrum, a semiconductor-semiconductor interface may provide a potential barrier that may be useful for detecting far-IR or terahertz radiation. The potential barrier may be formed at inorganic, organic, or combinations of inorganic and organic semiconductor heterojunctions.

In one or more embodiments of the invention, the potential barrier height of embodiments of the invention, and therefore the spectral range over which a given embodiment of the invention is useful, may be determined by the selection of materials. For example, in the case of a metal-semiconductor interface forming the potential barrier, an embodiment of the invention with gold-silicon metal-semiconductor interface may have a potential barrier height of ~0.80 eV and, accordingly, may be used for detection of light between 1.1 µm and 1.6 µm. As another example, an embodiment of the invention with an aluminum/germanium metal-semiconductor interface may have a potential barrier height of ~0.48 eV and, accordingly, may be used to detect light up to 2.6 µm.

In FIG. 1, as described above, a potential barrier 102 is formed at the interface of a plasmonic material 104 and a semiconductor 106. Upon illumination of incident electromagnetic radiation 108 through a transparent conducting layer 110, excited electrons, or "hot" electrons 112 in the plasmonic material 104 may have sufficient energy to overcome the potential barrier 102, resulting in a detectable current by the ammeter 114 (or other sensing device, e.g., a charge coupled device (CCD)). The photons incident on a the plasmonic material excite plasmons that rapidly decay to single "hot" electrons which may be capable of ballistic transport over the potential barrier 102, sometimes referred to as the Schottky barrier.

In one or more embodiments of the invention, a photon is incident on a material resulting in a surface plasmon, or surface plasmon polariton. The surface plasmon may produce non-equilibrium, energetic or "hot" electrons. Metallic nanostructures that support surface plasmons may exhibit a strong, collective resonant in response to a time varying electromagnetic field at a specific frequency. For example, the plasmon resonance may be determined, or engineered, by the type of metal, the geometry of various components of the invention, the dielectric environment, by coupling with adjacent particles, and size and orientation of the plasmonic material. A single photon may excite a single surface plasmon polariton near the plasmon resonance in metallic structures. The surface plasmon polaritons may decay either through radiation (scattering), or generate a single energetic "hot" electron. The efficiency of plasmon-induced hot electron production may depend on the electronic structure of the metal. In addition, the efficiency of the plasmon-induced hot electron production may also be controlled by alloying the metal with other metals or by placing nanostructures of different metals in close proximity to each other. The sensitivity to a wide range of parameters makes plasmonic structures highly tunable over a wide range of frequencies, including the ultra violet, visible, infrared, and Terahertz bands.

In one or more embodiments, the photon-to-electron current conversion mechanism of embodiments of the invention may involve the generation of localized surface plasmons on subwavelength metallic structures. Surface plasmons, or surface plasmon-polaritons are oscillations of an electron gas at an interface of metals and/or dielectrics. For a metal-semiconductor interface, the dielectric may be vacuum, air, liquid, poorly conductive material-such as silicon dioxide or other oxides, or a semiconductor.

Examples of structures that permit free space photons to directly couple with surface plasmon-polaritons include, but are not limited to, isolated nanostructures-such as rods, spheres, discs, and shells, independent aggregates of coupled nanostructures-such as dimers or heptamers, periodic variations in a metal film, finite nanostructures embedded in or adjacent to a metal film, or defects in a metal film with defects-such as holes or slits. All of the aforementioned coupling mechanisms may be either periodic or non-periodic and made of either dielectrics or metals. In addition, the aforementioned coupling mechanisms may be fabricated using a variety of methods, for example lithography or chemical growth and deposition. The coupling efficiencies may be highest when the particle size is less than the excitation wavelength.

One or more embodiments of the invention may permit the collection of plasmon-generated hot electrons as a photocurrent. A metal supporting a surface plasmon resonance is excited by photons, which may then decay to hot electrons. The hot electrons may have sufficient energy to cross an energy barrier (i.e., the potential barrier) and populate the conduction band of a semiconductor. Ohmic contacts with the plasmonic resonator and the semiconductor may form a complete circuit thereby allowing the hot electrons to be collected as current. Similar to the production of hot elections, an analogous "hot" hole embodiment of the invention may be possible if a p-type semiconductor is used.

In the absence of a plasmon resonance, the responsivity of a Schottky diode depends on the energy-dependent internal photoemission probability. This quantum transmission probability can be approximated by the modified Fowler theory, which describes the number of 'available' electrons in the system with sufficient kinetic energy normal to the interface to overcome the potential barrier:

$$\eta_i \approx C_F \frac{(hv - q\phi_B)^2}{hv} \quad (1)$$

Here, $C_F$ is the device specific Fowler emission coefficient, $hv$ is the photon energy, and $q\phi_B$ is the Schottky barrier energy.

When the Schottky barrier is formed by a plasmon resonant material, rather than a smooth film, the overall device responsivity R will show a Fowler response modified by the plasmon absorption spectrum S:

$$R(v) = \eta_i S(v) \quad (2)$$

Therefore, given this relation, it is possible to electrically measure the absorption spectrum of any plasmonic structure once the Schottky barrier height ($\phi_B$) is known.

Embodiments of the invention may be directly applicable to infrared focal plane array (FPA) imaging, solar power generation, infrared sensors and power meters with a linear response, and other applications based on infrared detection. The following is a non-limiting list of applications of one or more embodiments of the invention (i) silicon-based IR cameras, (ii) night vision systems, and (iii) IR-sensitized solar cells that increase the energy conversion efficiency of such solar cells by converting light of wavelengths below the semiconductor band gap into a useful photovoltage.

Embodiments of the invention may also be used for direct electrical detection of plasmonic absorption spectra, a technique which is both desirable and unavailable with existing spectroscopic methods, and the polarization detection over a broad wavelength range. In one or more embodiments of the invention, the low capacitance may allow embodiments of the invention to be used in high speed sensing applications.

The sensitivity of the embodiments of the invention incident wavelength, polarization, and power may enable embodiments of the invention to be used as detectors. Further, a single chip with an active area (made using one or more embodiments of the invention) with a size of a few microns may permit the characterization of a light source.

In one or more embodiments of the invention, the quantum efficiency of the embodiments of the invention may be altered by (i) the ratio of absorbed to scattered light, and (ii) the probability of a given hot electron crossing the potential barrier. In one or more embodiments of the invention, the ratio of the absorbed to scattered light and the probability of a given hot electron crossing the potential barrier may be minimized by the choice of design and materials used in implementing various embodiments of the invention. Classical electromagnetic modeling may be used to develop implementations of embodiments of the invention that include geometries with large absorption cross sections that may exhibit predominant absorption in the IR. The probability of hot electron transmission may be increased by selecting materials that give a low potential barrier height, such that the number of available electrons may be increased.

Figure 2:
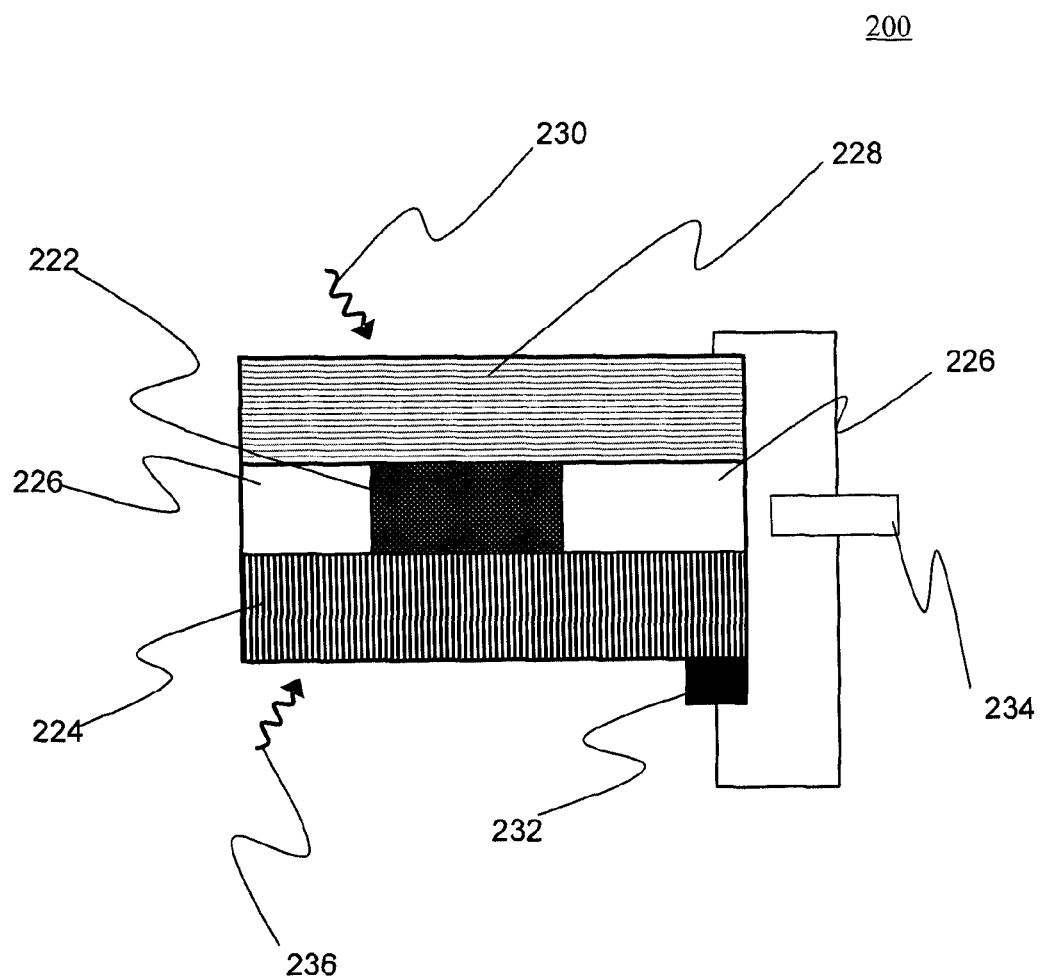
FIG. 2 shows a schematic in accordance with one or more embodiments of the invention.

FIG. 2 shows a schematic in accordance with one or more embodiments of the invention. A unit 200 of a photon to electron converter in accordance with one or more embodiments of the invention is shown. The unit 200 includes a plasmonic material 222 on a semiconductor 224, or other similar material. The unit 200 may also include insulators 226 adjacent to the plasmonic material 222. In one embodiment of the invention, plasmonic material 222 may include isolated nanostructures (e.g., rods, spheres, discs, and shells), independent aggregates of coupled nanostructures (e.g., dimmers, heptamers), periodic variations in a metal film, finite nanostructures embedded in or adjacent to a metal film, defects in a metal film with defects-such as holes or slits, or any combination thereof.

The top of the unit is coated with a transparent conductor 228. Light 230 excites the surface plasmons in the plasmonic material 222. As a result, excited electrons may have enough energy to overcome the potential barrier created between the plasmonic material 222 and the semiconductor 224. An ohmic contact 232 connected to the semiconductor may be used to supply the resultant current to a device 234. Depending on the materials used, in accordance with one or more embodiments of the invention, the semiconductor 224 may be transparent to the specific light being used or detected by the unit 200. Therefore, it may be possible for the plasmonic material 222 to be excited by light 236 incident through the semiconductor 224.

For example, in one or more embodiments of the invention, an array of independent rectangular gold nanostructures (e.g., plasmonic material 222) may be fabricated on an n-type silicon substrate (e.g., semiconductor 224). In one embodiment of the invention, a layer of titanium (e.g., 1 nm thick) (not shown) is interposed between the n-type silicon substrate and the rectangular gold nanostructures. Those skilled in the art will appreciate that other geometries for the plasmonic material may be used without departing from the invention.

Continuing with the discussion of the example, the plasmon resonances of a gold rectangle include a longitudinal and a transverse plasmon, corresponding to the long and short axis of the nanoscale rectangle. The plasmon resonance may be excited by light polarized along the corresponding orientation of the rectangle. The plasmon resonance frequency may be controlled by varying the dimensions and orientation of the nanostructures. For example, by increasing length of the rectangular gold nano structures, with light polarized parallel to the long axis of the rectangular gold nanostructures, the plasmon resonance may be tuned to lower photon energies. In one or more embodiments, an ohmic contact may be connected to the backside of the silicon wafer using an indium-tin solder. The front ohmic contact may be formed, for example, with a 50 nm thick layer of transparent indium tin oxide (ITO) surrounding the plasmonic gold nanostructure. Those skilled in the art will appreciate that other ohmic contacts may be used in place of ITO. In one embodiment of the invention, a 30 nm thick silicon dioxide (SiO$_2$) spacer layer may eliminate direct conduction between the silicon wafer and the ITO contact.

The transparent conductor 228 of the unit may affect the resonance wavelength of the plasmonic material 222, and therefore the sensitivity of a unit at a given wavelength. The contact of the plasmonic structure may be fabricated using any form of conductor, including, but not limited to, conductive oxides, metals, polymers, or liquids.

Figure 3:
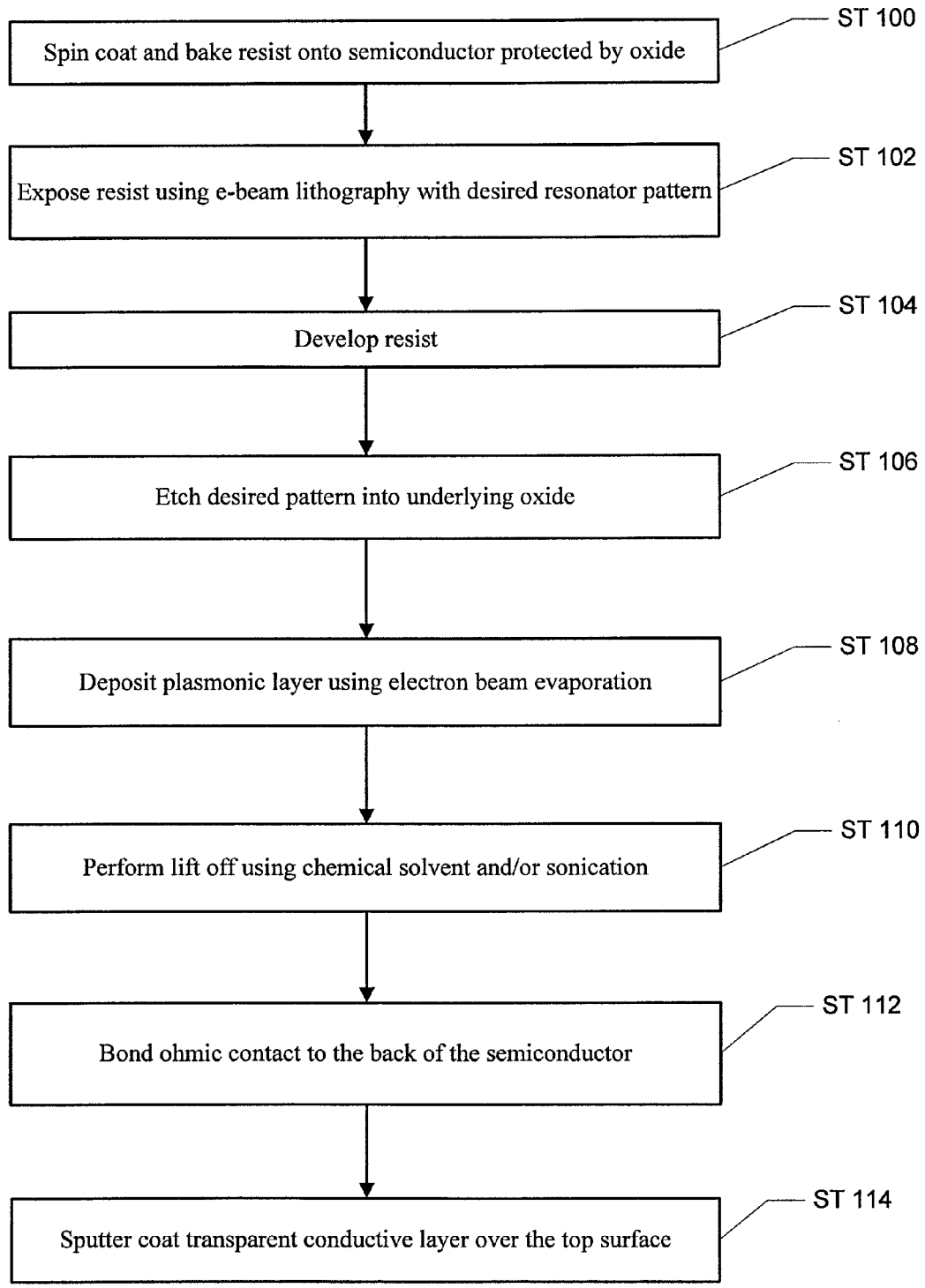
FIG. 3 shows a flowchart in accordance with one or more embodiments of the invention.

FIG. 3 shows a flowchart in accordance with one or more embodiments of the invention. While the various steps in the flowchart shown in FIG. 3 are presented and described sequentially, one of ordinary skill will appreciate that some or all of the steps may be executed in different orders, may be combined, or omitted, and some or all of the steps may be executed in parallel. Also, given the wide range of possible geometries and fabrication methods for the invention, the processing steps listed here are a sample method of fabricating one or more embodiments of the invention.

FIG. 3 shows a flowchart for manufacturing one or more embodiments of the invention. In ST 100, resist (i.e., a photosensitive material) may be spin coated and baked onto a semiconductor. For example, 950 WT PMMA resist may be spin coated onto a n-type, <100> silicon wafer with a 30 nm thickness. Then, the resist and semiconductor may be baked for 5 minutes at 180° C. In ST 102, the resist may be exposed using eletron beam lithography with a desired resonator pattern. As an example, an electron beam dose of 400 nC/cm² may be used with desired resonator pattern. In ST 104, the resist may be developed. For example, the resist may be develop for ~50 s using a developer of a ratio of 1:3 of methyl-iso-butyl-keytone (MIBK) and isopropyl alcohol (IPA).

In ST 106, a pattern may be etched into the oxide using an etchant. For example, an etchant of a ratio of 10:1 of ammonium fluoride ($NH_4F$) to hydrofluoric acid (HF) buffered oxide etch (BOE) for ~60 s etch. One of ordinary skill may recognize that the above etchant and time are required to remove ~30 nm of oxide. In ST 108, electron beam evaporation may be used to deposit a plasmonic layer. For example, electron beam evaporation may be used to deposit a gold layer approximately 30 nm thick. Alternatively, an approximately 1 nm thick layer of titanium may be deposited, followed by a gold layer approximately 30 nm thick. In ST 110, a lift off is performed using a chemical solvent and/or sonication. For example, acetone may be used to perform the lift off. In ST 112, an ohmic contact may be bonded to the back of the semiconductor. In the aforementioned example, the back of the silicon chip may be bonded to a metal contact with Indium solder. In ST 114, a transparent conductive layer may be sputter coated over the top of the surface. For example, a 50 nm thick indium tin oxide (ITO) layer may be sputter coated over the top surface of the device.

In accordance with one or more embodiments of the invention, the processing steps may vary due to different geometric requirements and the available resources for fabrication. One or more embodiment of the invention may be fabricated with other resists, with both wet and dry etchants, and with almost any combination of semiconducting substrate and plasmonic resonator.

The example method above may produce uniform arrays of units (200 in FIG. 2) with 250 nm center-to-center spacing between the plasmonic structure with negligible defects. The spacing was chosen to maximize packing density while eliminating near-field coupling between particles in accordance with one or more embodiments of the claimed invention. The spacing was also chosen to maintain a $SiO_2$ layer surrounding each device for lengths between 110 nm and 158 nm. A constant 50 nm width of the plasmonic structure may be employed.

Figure 4:
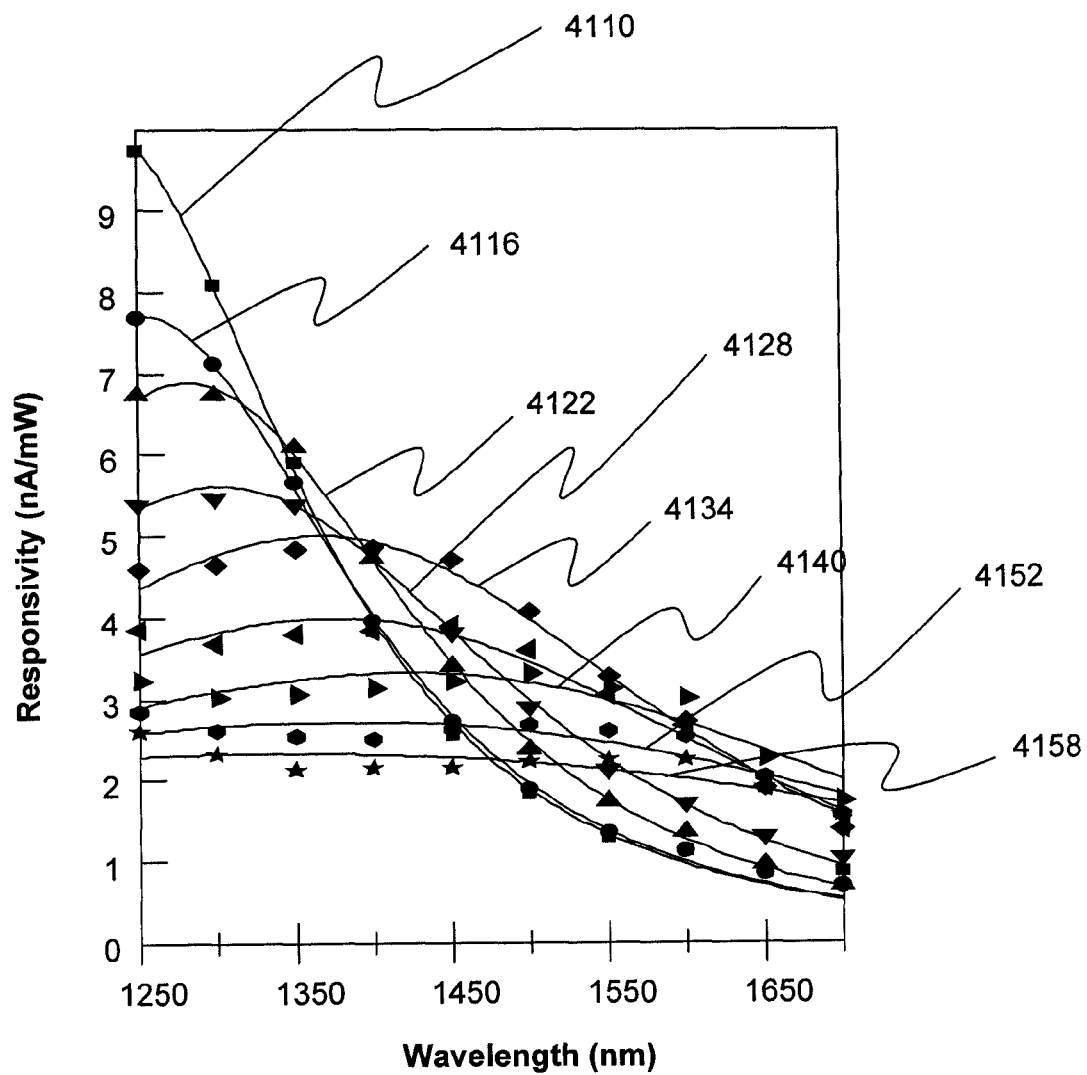
FIG. 4 shows experimental photocurrent efficiency in accordance with one or more embodiments of the invention.

Continuing with the above example, FIG. 4 is an experimentally measured photocurrent efficiency for nine difference rectangular resonator lengths in accordance with one or more embodiments of the claimed invention. All of the resonators shown in FIG. 4 are 50 nm wide and 30 nm high. FIG. 4 demonstrates the photocurrent efficiency for gold resonators of lengths 110, 116, 122, 128, 134, 140, 146, 152, and 158 nm. The last three digits of the reference numbers used in FIG. 4 indicate the length of the gold resonator. As will be shown below, the solid lines shown in FIG. 4 are theoretical fits to the data using equation (2) above for the potential barrier height of 0.5 eV. As expected from the plasmon resonance of the gold rectangular structures and spacing of the structures, the photocurrent efficiency as a function of wavelength varies with the different gold resonator lengths.

Figure 5A:
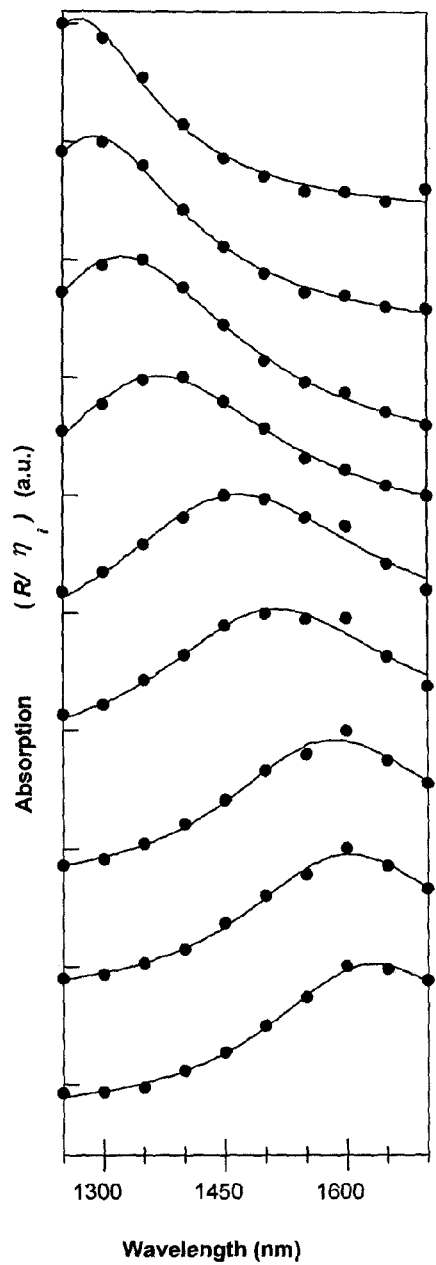
FIG. 5A shows photocurrent spectra in accordance with one or more embodiments of the invention.

FIG. 5A is the polarization dependence of photocurrent for the 140 nm length resonator in accordance with one or more embodiments of the invention. The 140 nm length gold resonator is driven at a wavelength of 1500 nm with the polarization aligned with the length of the gold resonator. As can be seen, the polarization dependence exhibits a cosine squared angular dependence, i.e. a dipole pattern. For light polarized along the short transverse axis, a greater than 90% attenuation of the photocurrent is observed. One or ordinary skill in the art will appreciate that the invention is not limited to dipole type behavior in the plasmonic material. For example, any plasmon resonance geometry that results in a detectable photocurrent may be used.

Figure 5B:
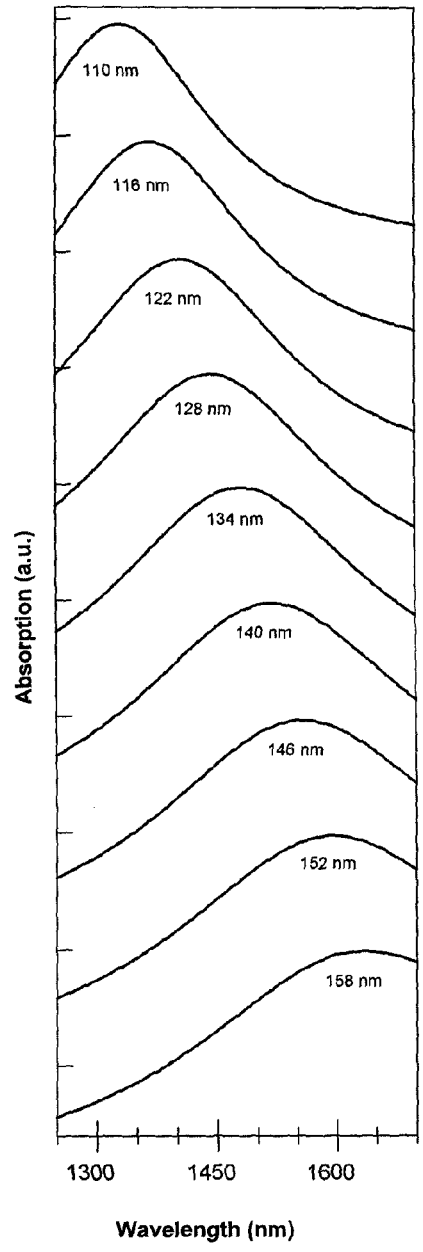
FIG. 5B shows calculated absorption spectra in accordance with one or more embodiments of the invention.

FIG. 5B is the photocurrent as a function of input power in accordance with one or more embodiments of the invention. The variation in input power at a single wavelength results in linear scaling of the photocurrent, which corresponds to the conversion of single photons to single hot electrons. Because of the dipolar response, $S(\upsilon)$ in equation (2) may be modeled as a Lorentzian curve, which allows the experimental responsivities to be fit to equation 2, which indicates a potential barrier height of 0.50 eV. The potential barrier height of 0.05 eV corresponds to a potential barrier dominated by the 1 nm Ti adhesion layer, and agrees closely with literature values for Ti/Si Schottky barrier devices. The low potential barrier height of titanium on silicon permits a detection window for these devices covering the entire short-wave infrared (SWIR) spectral regime (1.2 to 2.5 μm).

This linear response shown in FIG. 5B may allow for the mapping of resonator lengths to resonance wavelengths. At a fixed wavelength, different resonators geometries will produce photocurrent that is directly proportional to the relative amplitudes of their absorption spectra since $\eta_i$ is nearly constant for similar devices at a given energy. By measuring the photocurrent efficiency for an array of resonators with different lengths, the relative spectral amplitudes can be determined. For a resonator with a single dipole resonance, photocurrent is maximized when $\omega_{plasmon}=\omega_{laser}$ which may allow embodiments of the invention to function as extremely compact spectrometers. Photocurrent efficiency measurements of these devices may probe the plasmon absorption response as a function of multiple parameters, for example wavelength, geometry, incident power, and polarization angle. The overall photocurrent efficiency measured is proportional to the product of the probability of generating a hot electron, and the probability that a given hot electron will cross the potential barrier. When the transmission function is known, an absorption spectra may be extracted from photocurrent efficiency spectra. Extracting an absorption spectra may allow for direct measurement of the polarization response and power scaling behavior of the device because the potential barrier transmission probability may not vary with device geometry.

Figure 6A:
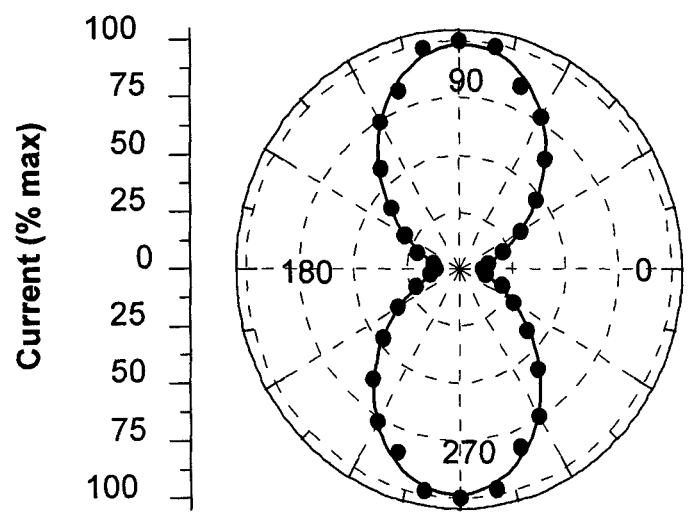
FIG. 6A shows polarization dependence of photocurrent in accordance with one or more embodiments of the invention.
Figure 6B:
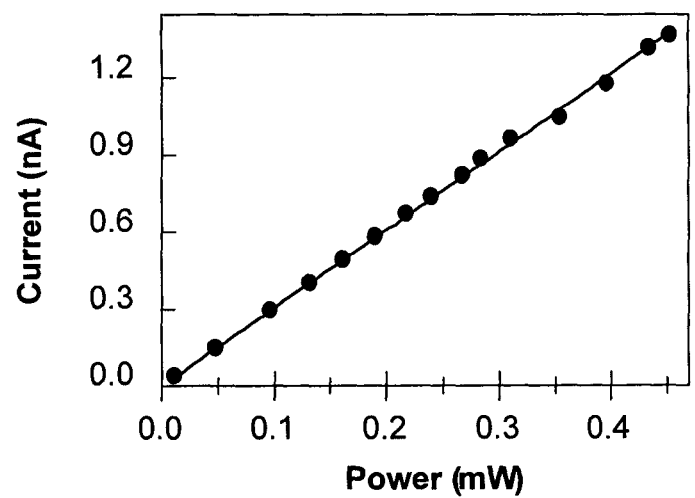
FIG. 6B shows photocurrent for a representative resonator in accordance with one or more embodiments of the invention.

FIG. 6A is photocurrent spectra extracted from the responsivity spectra fit with the corresponding Lorentzian curves in accordance with one or more embodiments of the invention. FIG. 6B is a theoretical calculated absorption spectra for each resonator geometry. FIG. 6B was calculated using finite difference time domain (FDTD) calculations, which included no adjustable parameters. The calculations shown in FIG. 6B were preformed with nominal length determined from lithography and literature values for the optical constants of Si, $SiO_2$, Au, and ITO. Both of the theoretical and experimental spectra exhibit linear tuning of the plasmon resonance in accordance with one or more embodiments of the invention.

Figure 7A:
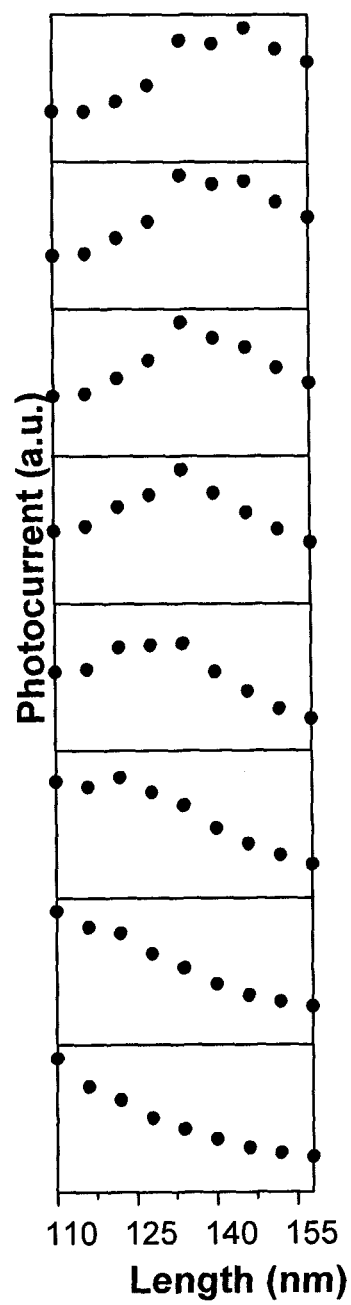
FIG. 7A shows relative photocurrent amplitudes in accordance with one or more embodiments of the invention.
Figure 7B:
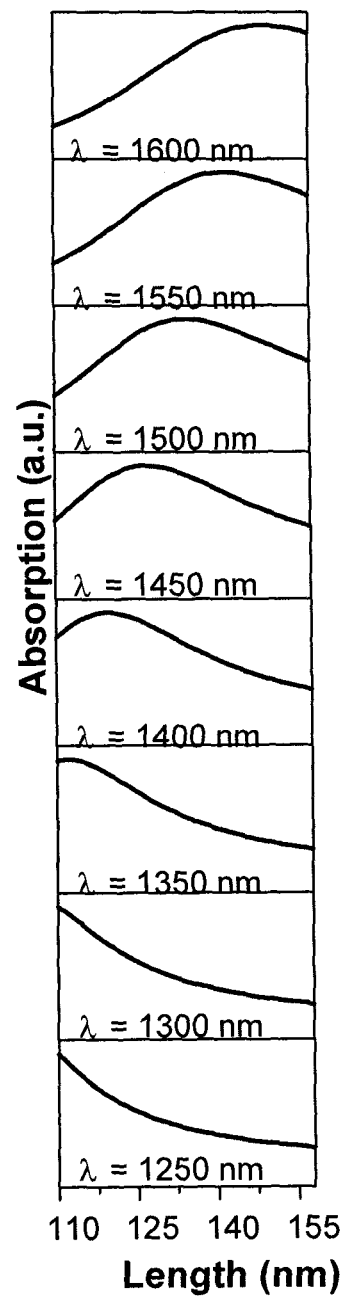
FIG. 7B shows calculated absorption amplitudes in accordance with one or more embodiments of the invention.

FIG. 7A is the relative photocurrent amplitudes at fixed wavelengths as a function of the nine resonator lengths in accordance with one or more embodiments of the invention. FIG. 7B is the FDTD calculated absorption amplitudes for devices that are nominally identical to the experimental devices in FIG. 7A in accordance with one or more embodiments of the invention. As was mentioned previously, for a resonator with a single dipole resonance, the photocurrent is maximized when the plasmon resonance of the material coincides with the wavelength of the laser.

In one embodiment of the invention, the overall quantum efficiency of one or more implementations of the invention depends on material and geometric parameters that affect two fundamental challenges: the efficiency of hot electron production, and the probability of collecting a given hot electron as current. Factors affecting the efficiency of the plasmon-induced hot electron production may include the resonator geometry, the electronic structure of the metal(s) comprising the resonator, and transmission of light through the electrical contacts. Further enhancements to the quantum efficiency of embodiments may include alloying the plasmonic resonator metal with other metals or by placing nanostructures of different metals in close proximity to each other. The conductive ITO layer may also double as an antireflection coating, increasing the percentage of incident light reaching the resonators. Limitations on converting hot electrons to current include the Schottky barrier height, which determines the number of available electrons, and the resistance in the circuit. Optimizing the aforementioned parameters may allow for enhanced device performance.

One or more embodiments of the invention may enable smaller detector volumes with reduced capacitance, which may provide a higher signal to noise ratio and faster operation. In addition, one or more embodiments of the invention may provide for infrared detection based on a plasmonic response to incident radiation. However, the aforementioned embodiments may not rely on a thermal response of the material or an engineered bandgap of the material. In the infrared region of the spectrum, engineered bandgap detectors rely on an engineered band-gap semiconductor. One or more embodiments of the invention may be less expensive and require less manufacturing complexities when compared to manufacturing a specific bandgap material.

In one or more embodiments of the invention, the plasmonic resonator may form the active detector region by functioning as both a source of energetic electrons and the material forming a potential barrier. By providing an IR detection capability based on quantum detection in the mid-infrared without complex engineered bandgap materials, one or more embodiments of the invention may open up a new class of IR detector with the potential for facile integration with existing technologies, low cost of production, and a high quantum efficiency.

Given the flexibility of one or more embodiments of the invention, the range of potential applications is extremely diverse. One or more embodiments of the invention may have the ability to characterize the wavelength, polarization, and power of an incident laser over a broad spectral region. One or more embodiments of the invention may be used in infrared focal plane array (FPA) imaging or IR-sensitized silicon solar cells, or applied to fundamental research where simple, direct measurements of absorption spectra are desirable.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A unit comprising:
   a semiconductor;
   a plasmonic material disposed on the semiconductor, wherein a potential barrier is formed between the plasmonic material and the semiconductor;
   an insulator disposed on the semiconductor and adjacent to the plasmonic material; and
   a transparent conductor disposed on the plasmonic material;
   wherein, upon illumination, the plasmonic material is excited resulting an excitation of an electron with sufficient energy to overcome the potential barrier,
   wherein the insulator contacts the semiconductor,
   wherein the transparent conductor contacts a top surface of the insulator and the plasmonic material, and
   wherein the insulator and the plasmonic material having a same thickness in between the transparent conductor and the semiconductor.

2. The unit of claim 1, further comprising:
   an ohmic contact bonded to the semiconductor, wherein the ohmic contact is electrically connected to a device and the transparent conductor.

3. The unit of claim 2, wherein the device comprises one selected from a group consisting of a charge coupled device (CCD) and an ammeter.

4. The unit of claim 1, wherein the transparent conductor is indium tin oxide.

5. The unit of claim 1, wherein the plasmonic material comprises gold.

6. The unit of claim 1, wherein the plasmonic material comprises a plurality of nano-rods.

7. The unit of claim 1, wherein the semiconductor is an n-type semiconductor.

8. The unit of claim 7, wherein the semiconductor comprises silicon.

9. The unit of claim 1, wherein the plasmonic material comprises a gold layer and a titanium layer, wherein the titanium layer is interposed between the gold layer and the semiconductor.

10. The unit of claim 1, wherein the plasmonic material comprises at least one selected from a group consisting of isolated nanostructures, independent aggregates of coupled nanostructures, a metal film with periodic variations, a metal film with embedded nanostructures, and a metal film with defects.

11. An apparatus, comprising:
    plurality of units, wherein each unit comprises:
    a semiconductor;
    a plasmonic material disposed on the semiconductor, wherein a potential barrier is formed between the plasmonic material and the semiconductor;
    an insulator disposed on the semiconductor and adjacent to the plasmonic material; and
    a transparent conductor disposed on the plasmonic material;
    wherein, upon illumination, the plasmonic material is excited resulting an excitation of an electron with sufficient energy to overcome the potential barrier,
    wherein the insulator contacts the semiconductor,
    wherein the transparent conductor contacts a top surface of the insulator and the plasmonic material, and wherein the insulator and the plasmonic material having a same thickness in between the transparent conductor and the semiconductor.

12. The apparatus of claim 11, wherein the plasmonic material comprises at least one selected from a group consisting of isolated nanostructures, independent aggregates of coupled nanostructures, a metal film with periodic variations, a metal film with embedded nanostructures, and a metal film with defects.

13. The apparatus of claim 11, wherein the plasmonic material comprises a gold layer and a titanium layer, wherein the titanium layer is interposed between the gold layer and the semiconductor.

14. The apparatus of claim 11, wherein the plasmonic material in each of the plurality of units comprises rods of different sizes.

15. The apparatus of claim 11, wherein the plasmonic material in each of the plurality of units comprises rods of different orientations.

16. The apparatus of claim 11, wherein the plasmonic material in each of the plurality of units comprises rods of different sizes and different orientations.

17. The apparatus of claim 11, wherein the apparatus is a sensing device.

* * * * *

UNITED STATES PATENT AND TRADEMARK OFFICE
CERTIFICATE OF CORRECTION

| | | |
|---|---|---|
| PATENT NO. | : 9,202,952 B2 | Page 1 of 1 |
| APPLICATION NO. | : 13/884552 | |
| DATED | : December 1, 2015 | |
| INVENTOR(S) | : Mark William Knight et al. | |

It is certified that error appears in the above-identified patent and that said Letters Patent is hereby corrected as shown below:

On the title page item 60 the words "Nov. 21, 2010" should read -- Nov. 12, 2010 --.

Signed and Sealed this
Twelfth Day of April, 2016

Michelle K. Lee
*Director of the United States Patent and Trademark Office*